US012646571B2

(12) United States Patent (10) Patent No.: US 12,646,571 B2
Liu et al. (45) Date of Patent: Jun. 2, 2026

(54) MEMORY CIRCUIT WITH DIFFERENTIAL SENSING ARCHITECTURE

(71) Applicant: Shanghai Huali Integrated Circuit Corporation, Shanghai (CN)

(72) Inventors: Hao Liu, Shanghai (CN); Xiaoming Hu, Shanghai (CN)

(73) Assignee: Shanghai Hauli Integrated Circuit Corporation, Shanghai (CN)

( * ) Notice: Subject to any disclaimer, the term of this patent is extended or adjusted under 35 U.S.C. 154(b) by 123 days.

(21) Appl. No.: 18/614,358

(22) Filed: Mar. 22, 2024

(65) Prior Publication Data

US 2025/0069671 A1 Feb. 27, 2025

(30) Foreign Application Priority Data

Aug. 24, 2023 (CN) .......................... 202311076264.0

(51) Int. Cl.
*G11C 16/28* (2006.01)
*G11C 16/04* (2006.01)
(52) U.S. Cl.
CPC .......... *G11C 16/28* (2013.01); *G11C 16/0408* (2013.01)
(58) Field of Classification Search
CPC ..... G11C 16/28; G11C 16/0408; G11C 16/26; G11C 7/062; G11C 16/0433
See application file for complete search history.

(56) References Cited

U.S. PATENT DOCUMENTS

| | | | | |
|---|---|---|---|---|
| 6,072,727 A * | 6/2000 | La Rosa | ................ | G11C 16/26 365/207 |
| 9,646,658 B1 * | 5/2017 | Park | ...................... | G11C 7/106 |
| 11,705,185 B2 * | 7/2023 | Vimercati | ........... | G11C 11/2255 365/185.21 |
| 2011/0026290 A1 * | 2/2011 | Noda | ................... | G11C 11/4097 365/205 |
| 2017/0236594 A1 * | 8/2017 | Yang | ...................... | G11C 16/28 365/185.21 |

* cited by examiner

*Primary Examiner* — Richard Elms
*Assistant Examiner* — Christopher Lane Reece
(74) *Attorney, Agent, or Firm* — Quarles & Brady LLP

(57) ABSTRACT

This application discloses a memory circuit. Each row of cells includes M+1 bit cells. First to Mth bit cells normally store M-bit data; an (M+1)th bit cell stores opposite data of an ith bit cell; each row of sense amplifiers includes M sense amplifiers; one positive input end of an ith sense amplifier is connected with an output end of the ith bit cell; one negative input end of the ith sense amplifier is connected with an output end of the (M+1)th bit cell; two positive input ends of a jth sense amplifier are connected with an output end of a jth bit cell; two negative input ends of the jth sense amplifier are respectively connected with an output end of the (M+1)th bit cell and an output end of the ith bit cell. The memory circuit can improve data retention and increase the utilization rate of the cells.

10 Claims, 8 Drawing Sheets

MEMORY CIRCUIT WITH DIFFERENTIAL SENSING ARCHITECTURE

CROSS-REFERENCES TO RELATED APPLICATIONS

This application claims priority to Chinese patent application No. CN202311076264.0 filed on Aug. 24, 2023, and entitled "MEMORY CIRCUIT", the disclosure of which is incorporated herein by reference in entirety.

TECHNICAL FIELD

This application relates to a memory technology, in particular to a memory circuit.

BACKGROUND

Conventional non-volatile cells (including Flash, EEPROM, EPROM, etc.) realize data storage in the form of storing charges in floating gates or charge tapping layers. The charge leakage produced over time ultimately leads to the loss of stored data. Therefore, data retention is one of the important indicators of cell performance. Data retention is not only influenced by the structure of cells and manufacturing processes, but also by storage/reading methods and circuits. After the selection and manufacturing processes of cells are fixed, improving data retention from the perspective of circuit design and data storage/reading methods has become an important breakthrough direction for non-volatile storage product (IP) to enter the automotive market.

In the existing technology, a read circuit that compares saturated current of a cell with reference current is as illustrated in FIG. 1. During the read cycle, the read address and reference address are selected and pre-charged to the same potential. Due to the difference between the cell current and the reference current iref, a potential difference between nodes is generated after the discharge cycle. The difference in potential is used as a differential signal to be input into the sense amplifier to read out the data stored in the cell. Here, the current of "0" cell is defined as high, while the current of "1" cell is defined as low. When the reference current iref is between the current of "0" cell and the current of "1" cell, after discharging, the current node potential of "1" cell is lower than the reference current node potential. One end of the cell acts as a positive feedback amplifier "+" input end, the Bit SA (bit sense amplifier) gives a read result "0". On the contrary, it gives a read result "1".

After all cells in the storage array store data, certain cell current statistical distribution is formed. Readout of each bit cell requires a separate read circuit. Therefore, considering external conditions such as temperature and power supply voltage, there is usually certain distribution of reference current corresponding to read circuits one to one (such as commonly used 32-bit readout form). Referring to FIG. 2, when storage products are used, current margins for reading out data are defined as read "0" margin and read "1" margin.

In actual use, a balance between read "0" margin and read "1" margin is achieved by fine-tuning the reference current iref, so as to achieve the most stable data reading effect. However, this storage/reading method has inherent weaknesses. Since storage product (IP) applications require that all cells are ensured to read correctly, both read "0" margin and read "1" margin depend on the weakest cell in the cell current statistical distribution, ultimately resulting in a small read margin.

In addition, the leakage of charge in the written data will cause change in the cell current distribution, as illustrated in FIG. 3. Since the current of "0" cell and the current of "1" cell are asymmetric, the optimal distinguishing current between the current of "0" cell and the current of "1" cell will drift with the change of write time, while the reference current iref does not change with time, further leading to a decrease in the read margin. Similarly, changes in temperature and power supply voltage may also introduce similar types of read margin losses.

The structure of the read circuit illustrated in FIG. 1 has two disadvantages. Firstly, to ensure correct reading of the entire array, the read margin is determined by the tail bit of the cell distribution. Secondly, a read margin loss is caused by comparing the current of the cell, which changes with time/temperature/power supply voltage, with the relatively constant reference current. One solution in the existing technology is as illustrated in FIG. 4, which uses differential pairs to store and read data. Adjacent differential cells store opposite numbers, and when reading, sense amplifiers are introduced into the nodes of the differential cells for comparison.

In the read circuit that compares the current of the differential cells illustrated in FIG. 4, the working principle of the differential cells is that when writing data in the form of differential pairs, "0" cell/"1" cell is defined as stored data "0", and "1" cell/"0" cell is defined as stored data "1". During the reading process, since the discharge current of "0" cell is greater than that of "1" cell, when comparing data, the potential on the side of "0" cell is low, so the differential combination of "0" cell/"1" cell reads "0", while the differential combination of "1" cell/"0" cell reads "1".

The structure of the differential cells can effectively improve the read margin and improve the data retention parameter of the memory. The main reason is that after using adjacent cells to write opposite values, the read margin is determined by the current difference between "0" cell and "1" cell, which theoretically is more than double that of the structure illustrated in FIG. 1. In fact, considering that the process conditions of adjacent cells are more similar, as illustrated in FIG. 5, for example, when the current of "0" cell is at a small position in the distribution, the adjacent "1" cell is also likely to have a smaller current. Therefore, the final comparison result is much larger than the readout circuit that compares with the reference current. In addition, since the differential data are stored in adjacent cells, the leakage of charges produced over time often only results in changes in the common mode signal, as illustrated in FIG. 6, which does not affect the differential mode signal and has a relatively small impact on the read result.

To sum up, the read circuit that compares the current of the differential cells can effectively improve data retention and improve the reliability of storage products. The only drawback is that every two adjacent cells store one-bit data, resulting in a significant decrease in the utilization of cells, which puts the flash products (IP) with differential cell structure in a disadvantaged position in terms of area competitiveness.

BRIEF SUMMARY

The technical problem to be solved by this application is to provide a memory circuit, which can not only effectively improve data retention, improve the reliability of storage products, but also increase the utilization rate of cells.

In order to solve the above technical problem, this application provides a memory circuit, including a cell array and a sense amplifier array;

the cell array including N rows of cells, N being a positive integer;

each row of cells including M+1 bit cells, first to Mth bit cells normally storing M-bit data, an (M+1)th bit cell storing opposite data of an ith bit cell, M being a positive integer and i being a positive integer less than or equal to M;

the sense amplifier array including N rows of sense amplifiers;

each row of sense amplifiers including M sense amplifiers, each sense amplifier being provided with a differential input port for reading stored data;

for the M sense amplifiers in the same row, one positive input end of an ith sense amplifier being connected with an output end of the ith bit cell, one negative input end of the ith sense amplifier being connected with an output end of the (M+1)th bit cell, two positive input ends of a jth sense amplifier being connected with an output end of a jth bit cell, two negative input ends of the jth sense amplifier being respectively connected with an output end of the (M+1)th bit cell and an output end of the ith bit cell, j being a positive integer less than or equal to M and unequal to i.

According to some embodiments, for the M sense amplifiers in the same row, two positive input ends of the ith sense amplifier are both connected with the output end of the ith bit cell, and two negative input ends of the ith sense amplifier are respectively connected with the output end of the (M+1)th bit cell and the output end of the ith bit cell.

According to some embodiments, the cells are non-volatile cells that store charges in floating gates or charge trapping layers.

According to some embodiments, the cells are Flash, EEPROM or EPROM.

According to some embodiments, the memory circuit further includes an auxiliary circuit;

the auxiliary circuit is configured to gate the cells, connect the cells with the sense amplifiers, and connect the sense amplifiers with a readout circuit.

According to some embodiments, the auxiliary circuit includes a plurality of transmission gate circuits, digital logic circuits, and driving circuits.

According to some embodiments, M is 2, 3, 4, 8, 16, 32, or 64.

According to some embodiments, a sense amplifier circuit includes a first PMOS transistor P1, a second PMOS transistor P2, a first NMOS transistor N1, a second NMOS transistor N2, a third NMOS transistor N3, a fourth NMOS transistor N4, a fifth NMOS transistor N5, and a sixth NMOS transistor N6;

source ends of the first PMOS transistor P1 and the second PMOS transistor P2 are connected with working voltage VDD;

a drain end of the first PMOS transistor P1 is connected with a drain end of the first NMOS transistor N1, a gate end of the second PMOS transistor P2, and a gate end of the second NMOS transistor N2;

a drain end of the second PMOS transistor P2 is connected with a drain end of the second NMOS transistor N2, a gate end of the first PMOS transistor P1, and a gate end of the first NMOS transistor N1, and serves as a read data output end of the sense amplifier circuit;

a source end of the first NMOS transistor N1 is connected with a drain end of the third NMOS transistor N3 and a drain end of the fifth NMOS transistor N5;

a source end of the second NMOS transistor N2 is connected with a drain end of the fourth NMOS transistor N4 and a drain end of the sixth NMOS transistor N6;

a gate end of the third NMOS transistor N3 and a gate end of the fifth NMOS transistor N5 serve as two positive input ends of the sense amplifier;

a gate end of the fourth NMOS transistor N4 and a gate end of the sixth NMOS transistor N6 serve as two negative input ends of the sense amplifier;

a source end of the third NMOS transistor N3, a source end of the fifth NMOS transistor N5, a source end of the fourth NMOS transistor N4, and a source end of the sixth NMOS transistor N6 are connected with a common ground end VSS.

According to some embodiments, the first PMOS transistor P1, the second PMOS transistor P2, the first NMOS transistor N1, the second NMOS transistor N2, the third NMOS transistor N3, the fourth NMOS transistor N4, the fifth NMOS transistor N5, and the sixth NMOS transistor N6 are field effect transistors.

According to some embodiments, the third NMOS transistor N3, the fourth NMOS transistor N4, the fifth NMOS transistor N5, and the sixth NMOS transistor N6 have the same dimension.

In the memory circuit provided in this application, the sense amplifier array stores/reads M data in M+1 cells, retaining the reading method in which the current is read by comparing the current of adjacent cells in a differential structure with each other. Due to the current distribution of adjacent "0" cell and "1" cell being slightly smaller or larger at the same time, a larger read margin can be ensured, as illustrated in FIG. 11. In addition, as illustrated in FIG. 12, the leakage of charges produced over time often only results in changes in the common mode signal, which can avoid the read margin loss caused by the reference current iref of the reference current type circuit not changing with the state of the cell, thus retaining the high reliability advantage of the large read margin of the differential cell structure. In the memory circuit provided in this application, the sense amplifier array retains the reading method in which the current is read by comparing the current of adjacent cells in a differential structure with each other, which largely inherits the advantages of differential cells, such as large read margin, excellent data retention parameter, and high reliability of storage products. At the same time, the utilization rate of the cells is M/M+1. When the value of M increases, it can make the utilization rate of the cells approach 100%, improving the utilization rate of the cells. Based on the positioning of the storage products, a balance can be found between reliability and area, and by selecting an appropriate value of M, the two opposing factors of the read margin and the storage product area can be balanced, which can not only effectively improve the data retention and improve the reliability of the storage products, but also improve the utilization rate of the cells and achieve the more optimized design of the storage products.

BRIEF DESCRIPTION OF THE DRAWINGS

In order to describe the technical solutions in this application more clearly, the following will briefly introduce drawings needed in this application. It is obvious that the drawings in the following description are only some embodiments of this application. Those skilled in the art may obtain other drawings from these drawings without contributing any inventive labor.

DETAILED DESCRIPTION OF THE EMBODIMENTS

The technical solutions in the embodiments of this application will be clearly and completely described below with reference to the drawings in the embodiments of this application. Apparently, the described embodiments are merely some rather than all of the embodiments of this application. All other embodiments obtained by those skilled in the art based on the embodiments of this application without contributing any inventive labor shall still fall within the scope of protection of this application.

Words such as "first", "second" and the like used in this application do not indicate any order, quantity, or importance, but are only intended to distinguish different components. Words such as "comprising", "including" and the like refer to a component or object that appears before the word including those listed after the word and their equivalents, without excluding other components or objects. Words such as "connecting", "connected" and the like are not limited to physical or mechanical connection, but can include electrical connection, whether direct or indirect. "Up", "down", "left", "right" and the like are only intended to represent relative positional relationships. When the absolute position of a described object changes, the relative positional relationship may also change accordingly.

It is to be understood that, without conflict, the embodiments and features in the embodiments of this application may be freely combined with each other.

Embodiment 1

A memory circuit includes a cell array and a sense amplifier array.

The cell array includes N rows of cells. N is a positive integer.

Figure 1:
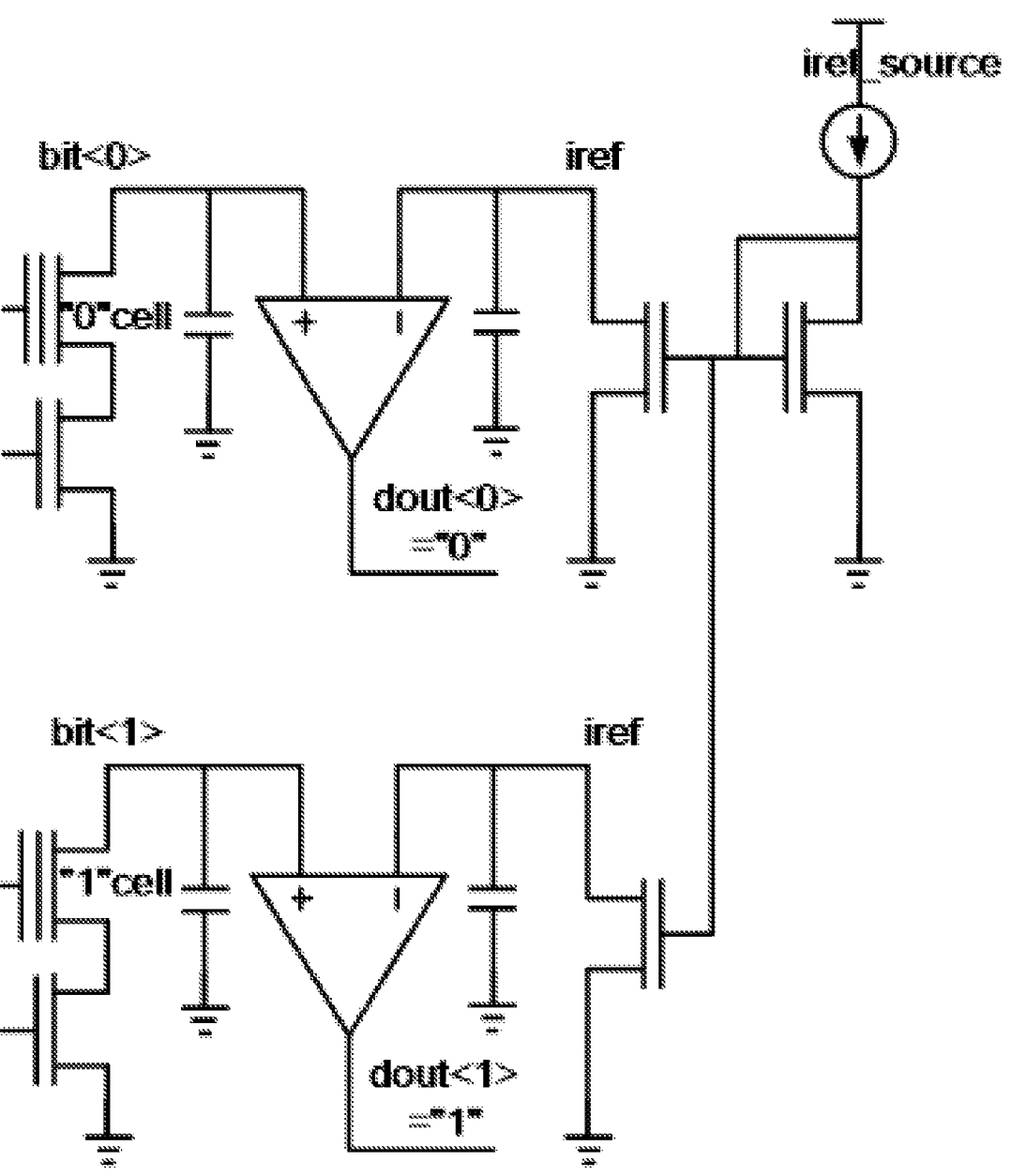
FIG. 1 illustrates an existing read circuit that compares cell current with reference current iref.
Figure 2:
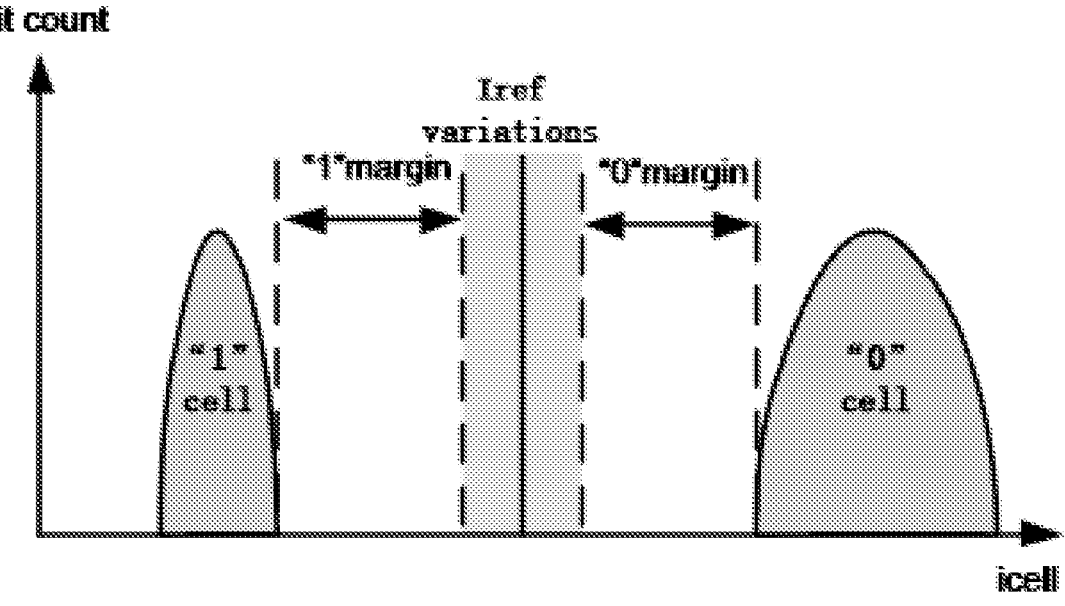
FIG. 2 illustrates one-bit cell current distribution and reference current distribution of the read circuit in FIG. 1 after initial writing.
Figure 3:
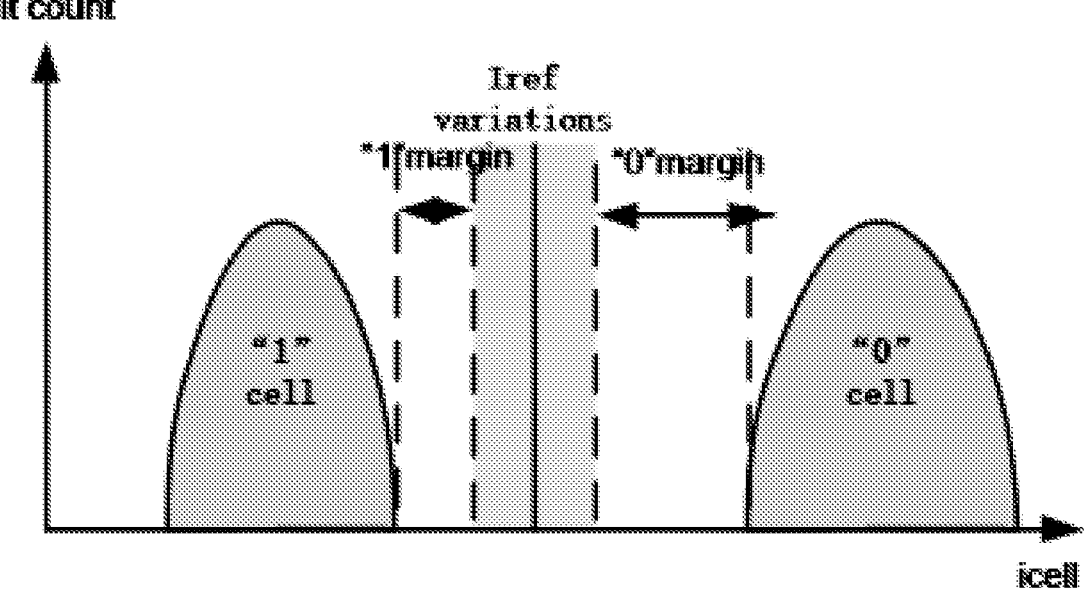
FIG. 3 illustrates one-bit cell current distribution and reference current distribution of the read circuit in FIG. 1 after stored charge leakage over time.
Figure 4:
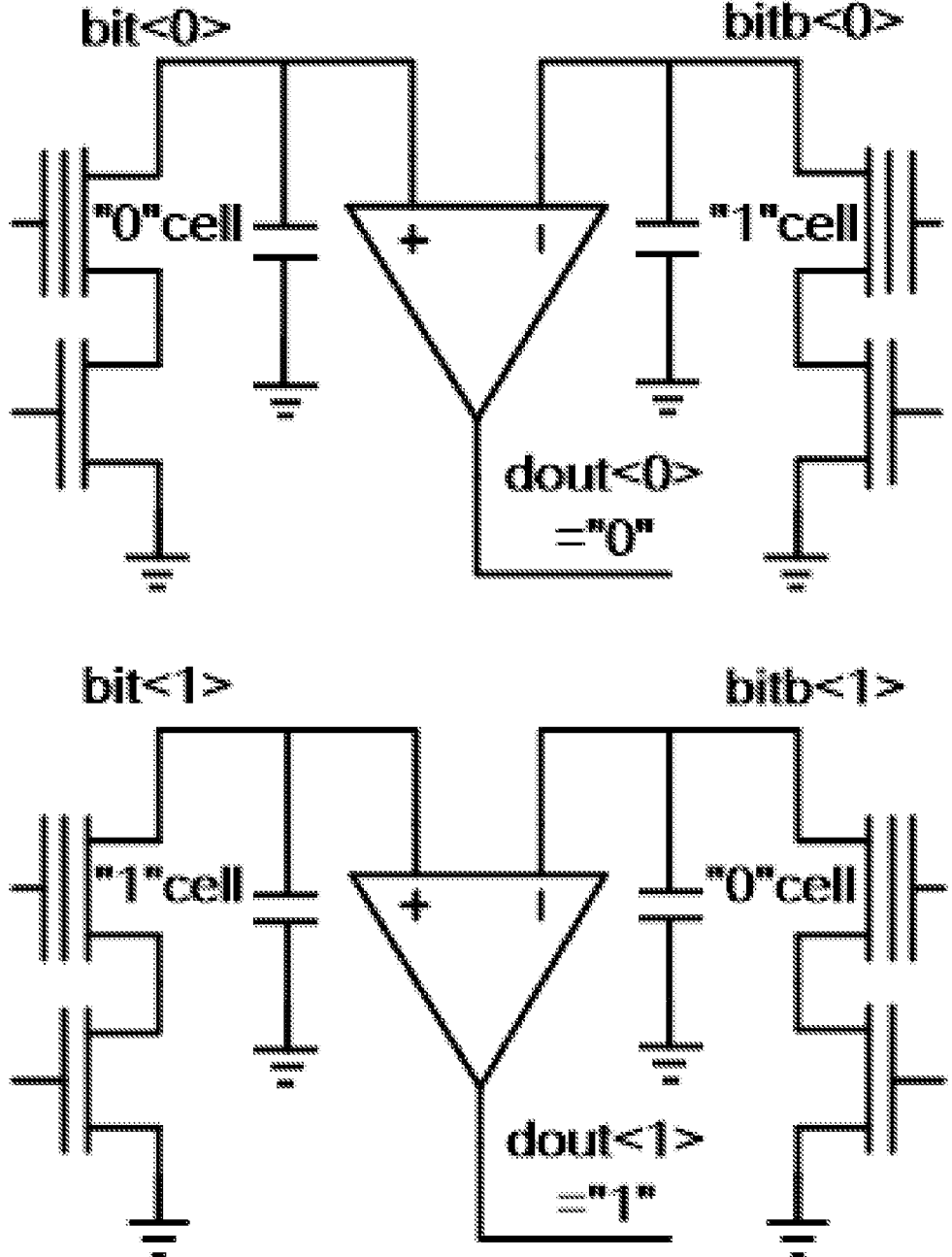
FIG. 4 illustrates an existing read circuit that compares differential cell current.
Figure 5:
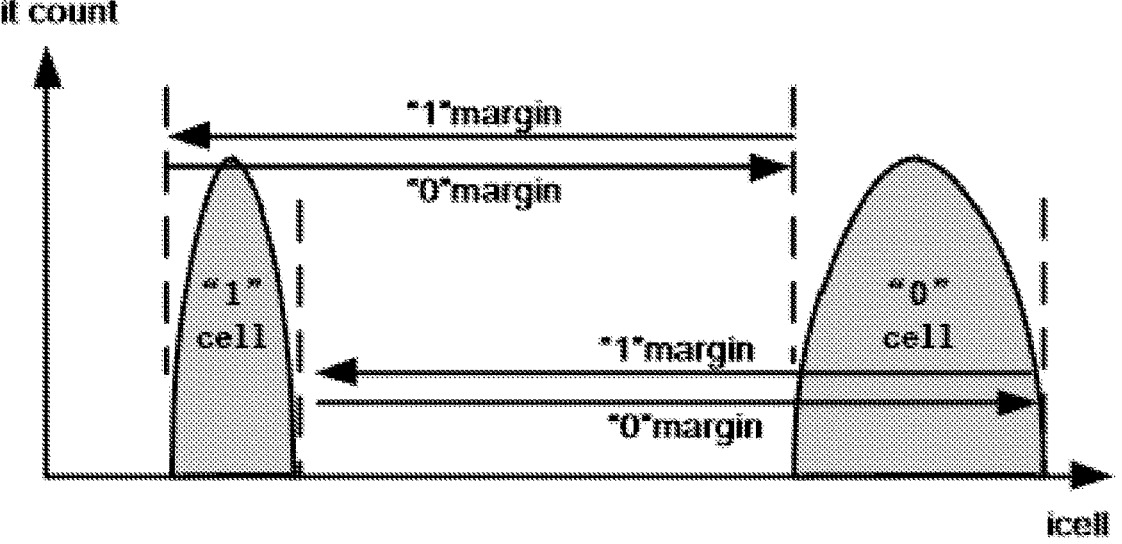
FIG. 5 illustrates one-bit cell current distribution of the read circuit in FIG. 4 after initial writing.
Figure 6:
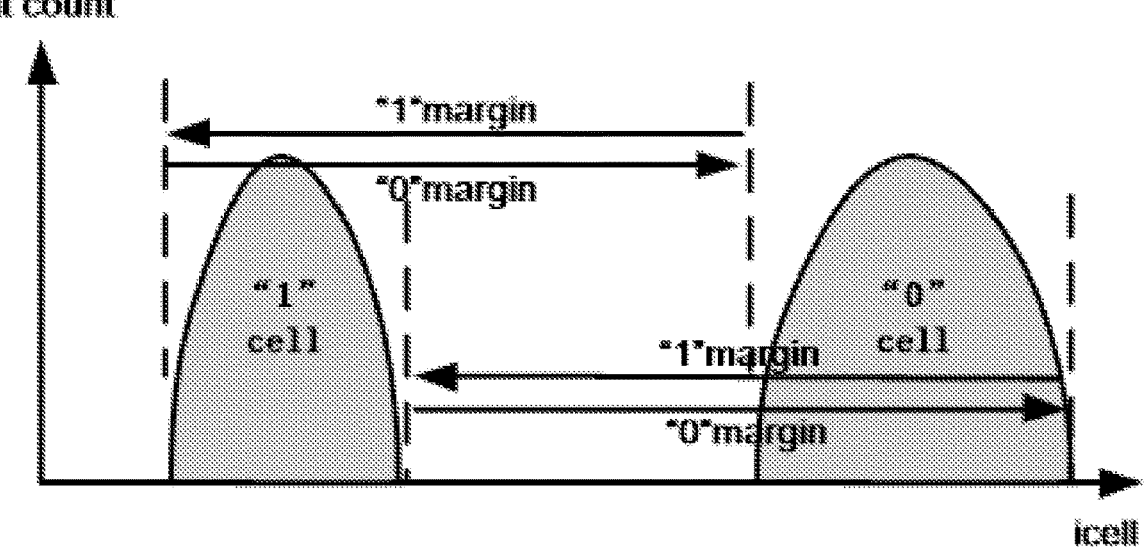
FIG. 6 illustrates one-bit cell current distribution of the read circuit in FIG. 4 after stored charge leakage over time.
Figure 7:
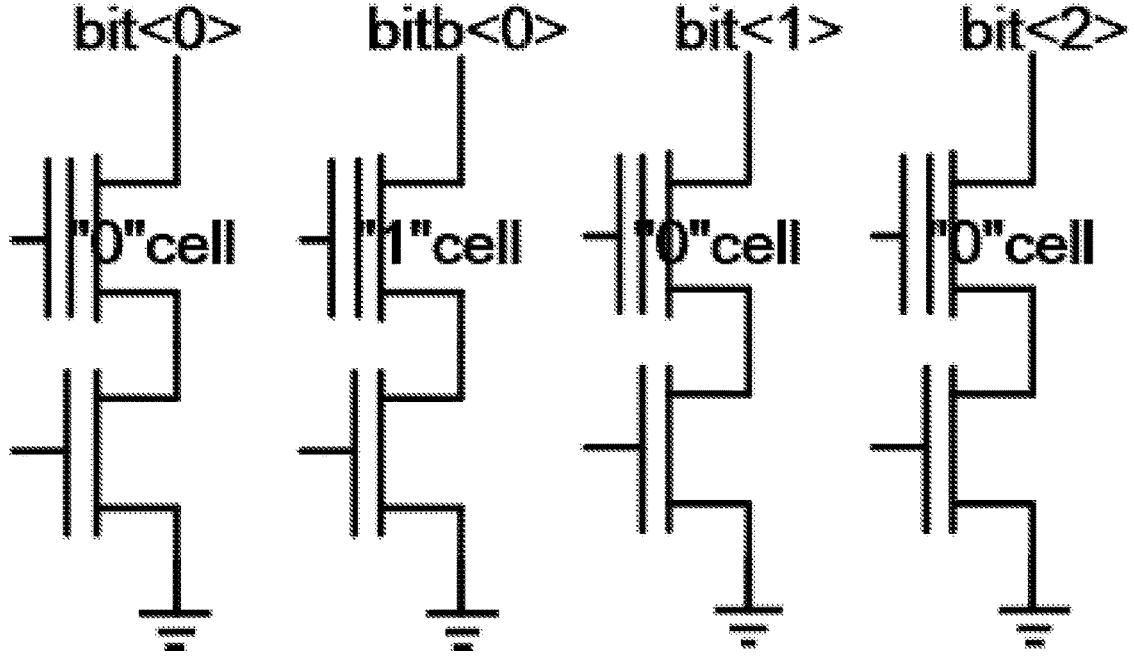
FIG. 7 illustrates a storage state diagram of a row of cells of a memory circuit according to an embodiment of this application.
Figure 9:
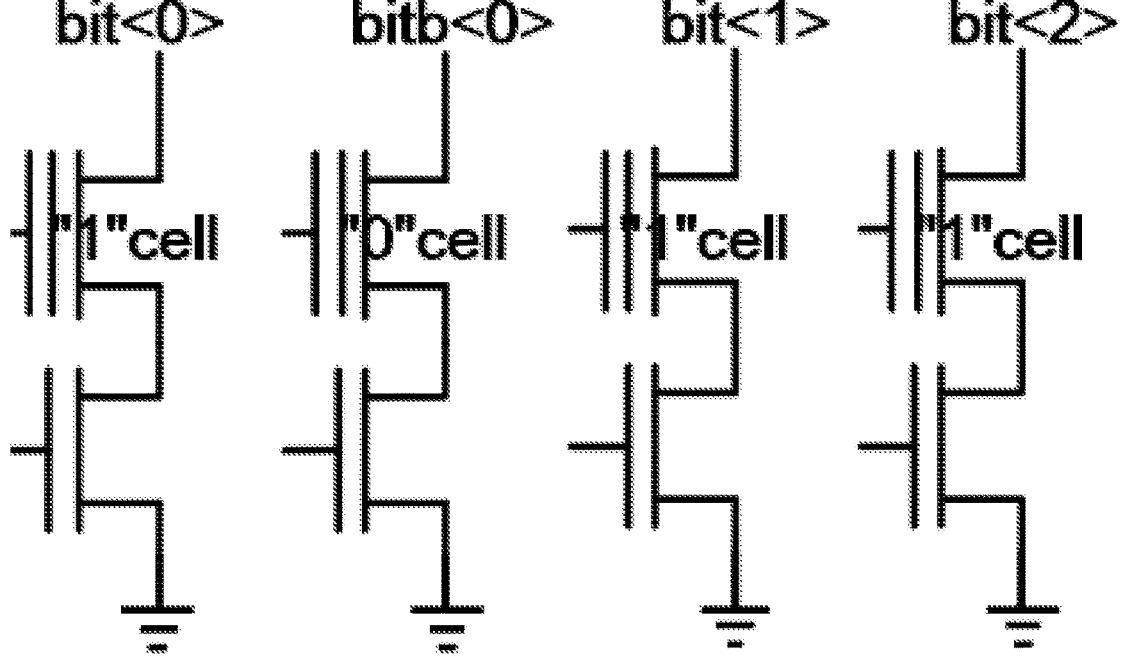
FIG. 9 illustrates a storage state diagram of another row of cells of a memory circuit according to an embodiment of this application.

Referring to FIG. 7 and FIG. 9, each row of cells includes M+1 bit cells. First to Mth bit cells normally store M-bit data. An (M+1)th bit cell stores opposite data of an ith bit cell. M is a positive integer and i is a positive integer less than or equal to M.

The sense amplifier array includes N rows of sense amplifiers.

Figure 8:
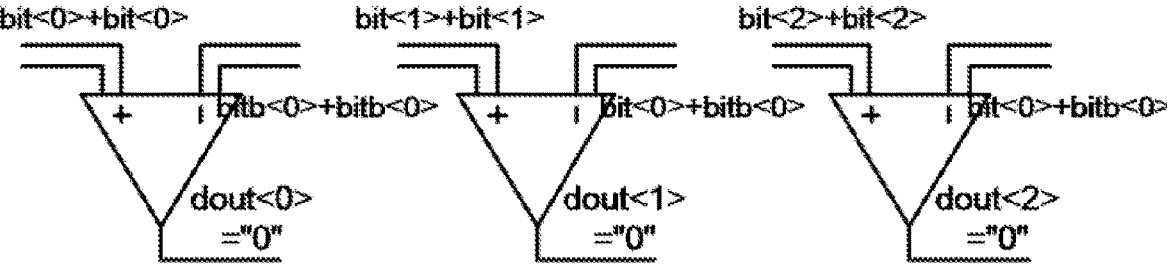
FIG. 8 illustrates a read state diagram of a row of sense amplifiers corresponding to the row of cells in FIG. 7.
Figure 10:
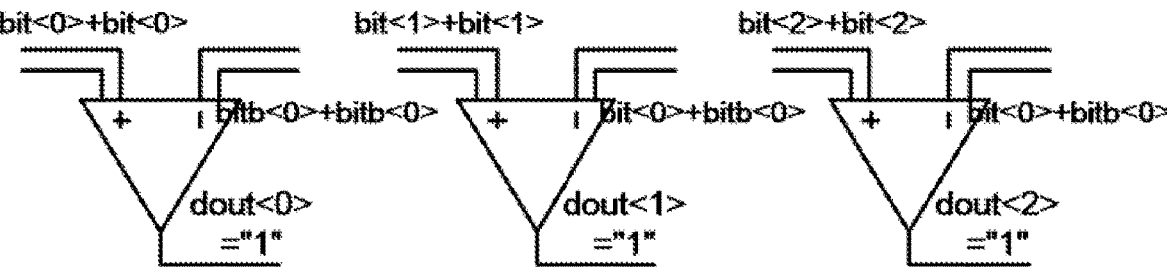
FIG. 10 illustrates a read state diagram of another row of sense amplifiers corresponding to the row of cells in FIG. 9.

Referring to FIG. 8 and FIG. 10, each row of sense amplifiers includes M sense amplifiers. Each sense amplifier is provided with a differential input port for reading stored data.

For the M sense amplifiers in the same row, one positive input end of an ith sense amplifier is connected with an output end of the ith bit cell, one negative input end of the ith sense amplifier is connected with an output end of the (M+1)th bit cell, two positive input ends of a jth sense amplifier are connected with an output end of a jth bit cell, two negative input ends of the jth sense amplifier are respectively connected with an output end of the (M+1)th bit cell and an output end of the ith bit cell, and j is a positive integer less than or equal to M and unequal to i.

The (M+1)th bit cell may be located at any position in the row where the cells are located. Taking M=3 as an example, three data are stored in four cells.

Referring to FIG. 7, FIG. 8, FIG. 9 and FIG. 10, three bits of input data din<0>, din<1> and din<2>, three bits of output data dout<0>, dout<1> and dout<2>, and four cells bit<0>, bitb<0>, bit<1> and bit<2> are defined.

The storage rule is that data din<0> is stored in a differential pair (with opposite storage states) in bit<0> and bitb<0>, while din<1> and din<2> are typically stored in bit<1> and bit<2>, as illustrated in FIG. 7 and FIG. 9. During reading, as illustrated in FIG. 8 and FIG. 10, dout<0> is read by adopting a differential reading method. Comparing the current of the cells bit<0> and bitb<0>, a read result is given. The reading of dout<1> still adopts a differential inputting method, the special point lies in that the "+" end of differential input is the samples of two bit<1> potentials, and the "−" end of differential input is the superposition of the samples of bit<0> and bitb<0> potentials. The method for reading dout<2> is the same as that for dout<1>.

When M=3, a row of four bit cells stores 3-bit data, and there are totally eight storage/read states, as shown in the table below:

| Cell state (storage) | | | | Readout data (output) | | |
|---|---|---|---|---|---|---|
| bit<0> | bitb<0> | bit<1> | bit<2> | dout<0> | dout<1> | dout<2> |
| 0 | 1 | 0 | 0 | 0 | 0 | 0 |
| 0 | 1 | 0 | 1 | 0 | 0 | 1 |
| 0 | 1 | 1 | 0 | 0 | 1 | 0 |
| 0 | 1 | 1 | 1 | 0 | 1 | 1 |
| 1 | 0 | 0 | 0 | 1 | 0 | 0 |
| 1 | 0 | 0 | 1 | 1 | 0 | 1 |
| 1 | 0 | 1 | 0 | 1 | 1 | 0 |
| 1 | 0 | 1 | 1 | 1 | 1 | 1 |

Taking "000" and "111" as examples, referring to FIG. 7, a data storage state in a row of four bit cells is arranged as "0100", and referring to FIG. 8, readout data is "000"; referring to FIG. 9, a data storage state in a row of four bit cells is arranged as "1011", and referring to FIG. 10, read data is "111".

The readout principle is as follows: the readout principle of dout<0> is exactly the same as that of differential flash storage products (flash IP). When bit<0>/bitb<0> store "0"/"1" respectively, the current of bit<0> is larger than that of bitb<0>. After discharging, the node potential of bit<0> is lower than that of bitb<0>. According to the positive feedback amplification principle of the sense amplifier (SA), the output result of dout<0> is "0", and vice versa, the output result is "1".

The reading method from dout<1> to dout<M−1> is the same, another principle of comparing cell current is adopted. Bit potential sampling circuits of sense amplifiers are as illustrated in FIG. 8 and FIG. 10. In a case that the storage state of bit<1> is "0", the "+" end of differential input is the samples of two "0" potentials. Since bit<0>/bitb<0> are always opposite values according to the storage rule, the "−" end of differential input is always the samples of "0" and "1" potentials. At this time, the equivalent input potential of the "+" end is lower than that of the "−" end, and the output result of dout<1> is "0". In a case that the storage state of bit<1> is "1", the input of the "+" end is the samples of two "1" potentials, and the input of the "−" end is the samples of constant "0" and "1" potentials. At this time, the equivalent input potential of the "+" end is higher than that of the "−" end, and the output result of dout<1> is "1".

In a case that the storage state of bit<1> is "0", the "+" end of differential input is the samples of two "0" potentials. Since bit<0>/bitb<0> are always opposite values according to the storage rule, the "−" end of differential input is the samples of "0" and "1" potentials. At this time, the equivalent input potential of the "+" end is lower than that of the "−" end, and the output result of dout<1> is "0".

In a case that the storage state of bit<1> is "1", the "+" end of differential input is the samples of two "1" potentials. Since bit<0>/bitb<0> are always opposite values according to the storage rule, the "−" end of differential input is always the samples of "0" and "1" potentials. At this time, the equivalent input potential of the "+" end is higher than that of the "−" end, and the output result of dout<1> is "1".

The storage/reading method of bit<2> to bit<M−1> is the same as above.

In the memory circuit in embodiment 1, M-bit data are stored in M+1 bit cells in the same row, M bit cells store M-bit normal data, and an (M+1)th bit cell stores opposite data of an ith bit cell; M sense amplifiers in the same row, when reading the data stored in the cells in the corresponding row, compare the current of the ith bit cell and the (M+1)th bit cell storing the opposite data for differential reading, and read out the ith bit stored data; the current of the remaining M−1 bit cell is compared with the average current of the two bit cells storing the opposite data for differential reading, which is defined as readout 1 or 0.

Figure 11:
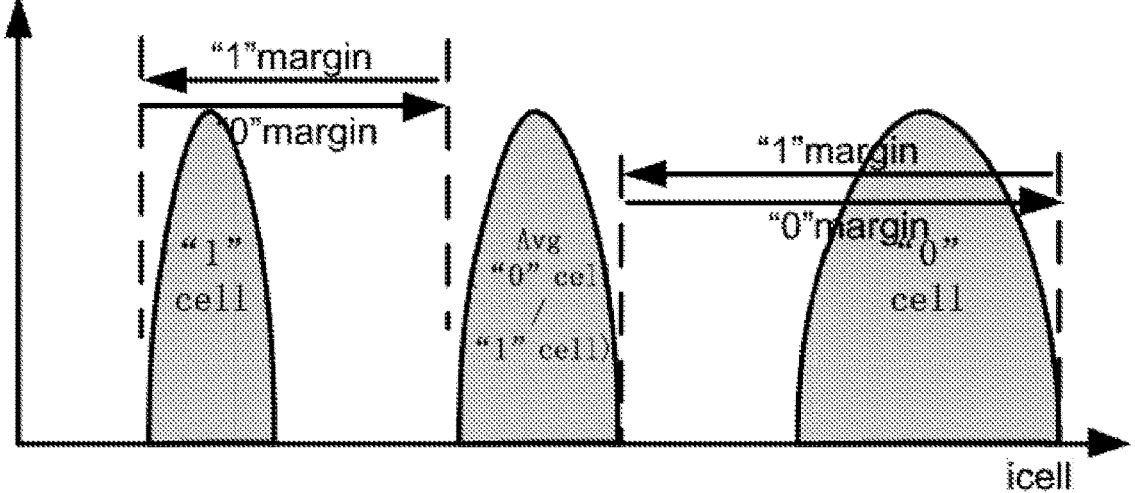
FIG. 11 illustrates one-bit cell current distribution of the read circuits in FIG. 7 and FIG. 9 after initial writing.
Figure 12:
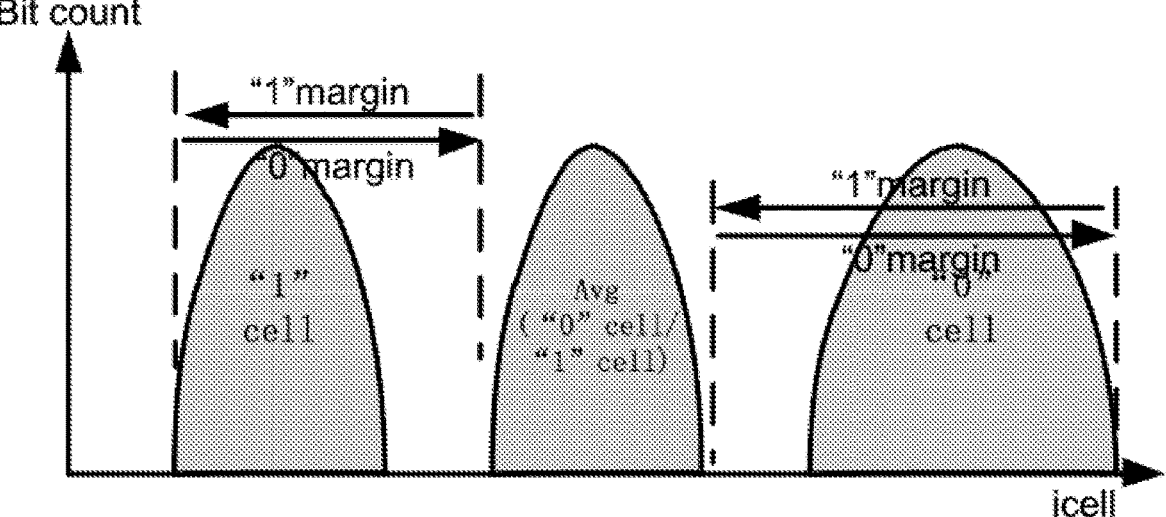
FIG. 12 illustrates one-bit cell current distribution of the read circuits in FIG. 7 and FIG. 9 after stored charge leakage over time.

In the memory circuit in embodiment 1, the sense amplifier array stores/reads M data in M+1 cells, retaining the reading method in which the current is read by comparing the current of adjacent cells in a differential structure with each other. Due to the current distribution of adjacent "0" cell and "1" cell being slightly smaller or larger at the same time, a larger read margin can be ensured, as illustrated in FIG. 11. In addition, as illustrated in FIG. 12, the leakage of charges produced over time often only results in changes in the common mode signal, which can avoid the read margin loss caused by the reference current iref of the reference current type circuit not changing with the state of the cell, thus retaining the high reliability advantage of the large read margin of the differential cell structure. In the memory circuit in embodiment 1, the sense amplifier array retains the reading method in which the current is read by comparing the current of adjacent cells in a differential structure with each other, which largely inherits the advantages of differential cells, such as large read margin, excellent data retention parameter, and high reliability of storage products. At the same time, the utilization rate of the cells is M/M+1. When the value of M increases, it can make the utilization rate of the cells approach 100%, improving the utilization rate of the cells. Based on the positioning of the storage products, a balance can be found between reliability and area, and by selecting an appropriate value of M, the two opposing factors of the read margin and the storage product area can be balanced, which can not only effectively improve the data retention and improve the reliability of the storage products, but also improve the utilization rate of the cells and achieve the more optimized design of the storage products.

Usually, a storage product is composed of a peripheral circuit and cells, and as the capacity increases, the storage area gradually becomes dominant. Referring to conventional storage products, when the capacity is greater than 256 KB, the area of two cells used for storing 1-bit data is more than 1.8 times the reference structure area; the area of four cells used for storing 3-bit data is about 1.25 times the reference structure area; the area of eight cells used for storing 7-bit data is about 1.13 times the reference structure area. It is evident that as M increases, the structure of using M+1 cells to store M-bit data significantly improves the area utilization rate of the storage products.

Embodiment 2

Based on the memory circuit in embodiment 1, for the M sense amplifiers in the same row, two positive input ends of the ith sense amplifier are both connected with the output end of the ith bit cell, and two negative input ends of the ith sense amplifier are respectively connected with the output end of the (M+1)th bit cell and the output end of the ith bit cell.

According to some embodiments, the cells are non-volatile cells that store charges in floating gates or charge trapping layers.

According to some embodiments, the cells are Flash, EEPROM, EPROM, or the like.

According to some embodiments, the memory circuit further includes an auxiliary circuit;

the auxiliary circuit is configured to gate the cells, connect the cells with the sense amplifiers, and connect the sense amplifiers with a readout circuit.

According to some embodiments, the auxiliary circuit includes a plurality of transmission gate circuits, digital logic circuits, and driving circuits.

According to some embodiments, M is 2, 3, 4, 8, 16, 32, 64, or the like.

Embodiment 3

Figure 13:
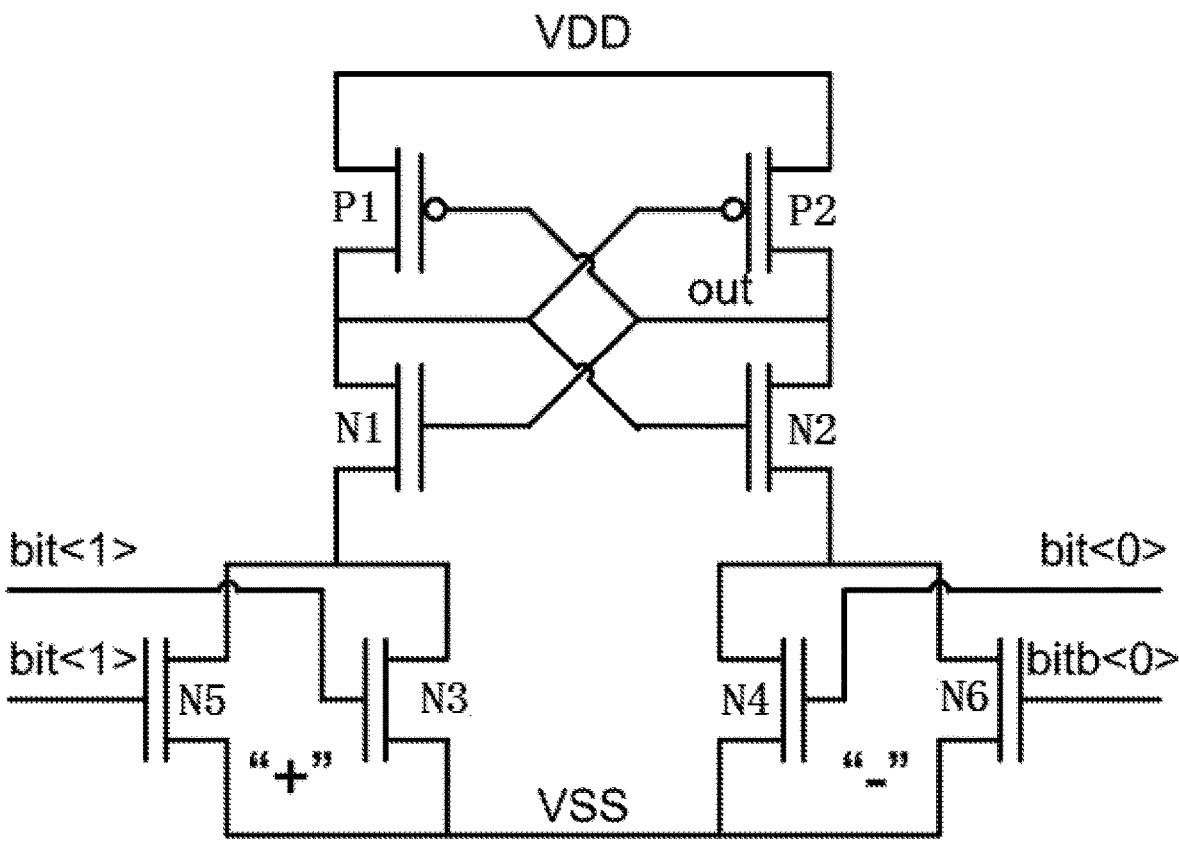
FIG. 13 illustrates a circuit diagram of a sense amplifier of a memory circuit according to an embodiment of this application.

Based on the memory circuit in embodiment 1, referring to FIG. 13, a sense amplifier circuit includes a first PMOS transistor P1, a second PMOS transistor P2, a first NMOS transistor N1, a second NMOS transistor N2, a third NMOS transistor N3, a fourth NMOS transistor N4, a fifth NMOS transistor N5, and a sixth NMOS transistor N6;

source ends of the first PMOS transistor P1 and the second PMOS transistor P2 are connected with working voltage VDD;

a drain end of the first PMOS transistor P1 is connected
with a drain end of the first NMOS transistor N1, a gate
end of the second PMOS transistor P2, and a gate end
of the second NMOS transistor N2;

a drain end of the second PMOS transistor P2 is connected
with a drain end of the second NMOS transistor N2, a
gate end of the first PMOS transistor P1, and a gate end
of the first NMOS transistor N1, and serves as a read
data output end OUT of the sense amplifier circuit;

a source end of the first NMOS transistor N1 is connected
with a drain end of the third NMOS transistor N3 and
a drain end of the fifth NMOS transistor N5;

a source end of the second NMOS transistor N2 is
connected with a drain end of the fourth NMOS tran-
sistor N4 and a drain end of the sixth NMOS transistor
N6;

a gate end of the third NMOS transistor N3 and a gate end
of the fifth NMOS transistor N5 serve as two positive
input ends of the sense amplifier;

a gate end of the fourth NMOS transistor N4 and a gate
end of the sixth NMOS transistor N6 serve as two
negative input ends of the sense amplifier;

a source end of the third NMOS transistor N3, a source
end of the fifth NMOS transistor N5, a source end of the
fourth NMOS transistor N4, and a source end of the
sixth NMOS transistor N6 are connected with a com-
mon ground end VSS.

According to some embodiments, the first PMOS transis-
tor P1, the second PMOS transistor P2, the first NMOS
transistor N1, the second NMOS transistor N2, the third
NMOS transistor N3, the fourth NMOS transistor N4, the
fifth NMOS transistor N5, and the sixth NMOS transistor N6
are field effect transistors.

According to some embodiments, the third NMOS tran-
sistor N3, the fourth NMOS transistor N4, the fifth NMOS
transistor N5, and the sixth NMOS transistor N6 have the
same dimension.

In the memory circuit in embodiment 3, the "+" end of
differential input of the sense amplifier circuit is the samples
of two output end potentials from the same cell, and the
input circuit includes two N-type field effect transistors, i.e.,
the third NMOS transistor N3 and the fifth NMOS transistor
N5; the "−" end of differential input of the sense amplifier
circuit is the samples output end potentials of two differen-
tial cells of the known differentially-stored, and the input
circuit includes two N-type field effect transistors, i.e., the
fourth NMOS transistor N4 and the sixth NMOS transistor
N6. After sampling, the positive feedback amplification
structure composed of the first NMOS transistor N1, the
third NMOS transistor N3, the first PMOS transistor P1 and
the second PMOS transistor P2 at the upper end performs
amplification to output a digital result "0" or "1".

What are described above are only exemplary embodi-
ments of this application, and are not intended to limit this
application. Any modifications, equivalent replacements,
improvements and the like made within the spirit and
principle of this application shall be all included in the scope
of protection of this application.

What is claimed is:

1. A memory circuit, comprising a cell array and a sense
amplifier array;

the cell array comprising N rows of cells, N being a
positive integer;

each row of cells comprising M+1 bit cells, first to Mth bit
cells normally storing M-bit data, an (M+1)th bit cell storing opposite data of an ith bit cell, M being a
positive integer and i being a positive integer less than
or equal to M;

the sense amplifier array comprising N rows of sense
amplifiers;

each row of sense amplifiers comprising M sense ampli-
fiers, each sense amplifier being provided with a dif-
ferential input port for reading stored data; and for the M sense amplifiers in the same row, one positive
input end of an ith sense amplifier being connected with
an output end of the ith bit cell, one negative input end
of the ith sense amplifier being connected with an
output end of the (M+1)th bit cell, two positive input
ends of a jth sense amplifier being connected with an
output end of a jth bit cell, two negative input ends of
the jth sense amplifier being respectively connected
with an output end of the (M+1)th bit cell and an output
end of the ith bit cell, j being a positive integer less than
or equal to M and unequal to i;

the potential samples of two differential positive input
ends of the sense amplifier are superimposed, and the
potential samples of two differential negative input
ends of the sense amplifier are superimposed.

2. The memory circuit according to claim 1, wherein for the M sense amplifiers in the same row, two positive
input ends of the ith sense amplifier are both connected
with the output end of the ith bit cell, and two negative
input ends of the ith sense amplifier are respectively
connected with the output end of the (M+1)th bit cell
and the output end of the ith bit cell.

3. The memory circuit according to claim 1, wherein the cells are non-volatile cells that store charges in float-
ing gates or charge trapping layers.

4. The memory circuit according to claim 1, wherein the cells are Flash, EEPROM or EPROM.

5. The memory circuit according to claim 1, wherein the memory circuit further comprises an auxiliary circuit;
and the auxiliary circuit is configured to gate the cells, connect
the cells with the sense amplifiers, and connect the
sense amplifiers with a readout circuit.

6. The memory circuit according to claim 1, wherein the auxiliary circuit comprises a plurality of transmission
gate circuits, digital logic circuits, and driving circuits.

7. The memory circuit according to claim 1, wherein M is
2, 3, 4, 8, 16, 32, or 64.

8. The memory circuit according to claim 1, wherein a sense amplifier circuit comprises a first PMOS transistor
(P1), a second PMOS transistor (P2), a first NMOS
transistor (N1), a second NMOS transistor (N2), a third
NMOS transistor (N3), a fourth NMOS transistor (N4),
a fifth NMOS transistor (N5), and a sixth NMOS
transistor (N6);

source ends of the first PMOS transistor (P1) and the
second PMOS transistor (P2) are connected with work-
ing voltage (VDD);

a drain end of the first PMOS transistor (P1) is connected
with a drain end of the first NMOS transistor (N1), a
gate end of the second PMOS transistor (P2), and a gate
end of the second NMOS transistor (N2);

a drain end of the second PMOS transistor (P2) is con-
nected with a drain end of the second NMOS transistor
(N2), a gate end of the first PMOS transistor (P1), and
a gate end of the first NMOS transistor (N1), and serves
as a read data output end of the sense amplifier circuit;

a source end of the first NMOS transistor (N1) is connected with a drain end of the third NMOS transistor (N3) and a drain end of the fifth NMOS transistor (N5);

a source end of the second NMOS transistor (N2) is connected with a drain end of the fourth NMOS transistor (N4) and a drain end of the sixth NMOS transistor (N6);

a gate end of the third NMOS transistor (N3) and a gate end of the fifth NMOS transistor (N5) serve as two positive input ends of the sense amplifier;

a gate end of the fourth NMOS transistor (N4) and a gate end of the sixth NMOS transistor (N6) serve as two negative input ends of the sense amplifier; and a source end of the third NMOS transistor (N3), a source end of the fifth NMOS transistor (N5), a source end of the fourth NMOS transistor (N4), and a source end of the sixth NMOS transistor (N6) are connected with a common ground end (VSS).

9. The memory circuit according to claim 8, wherein the first PMOS transistor (P1), the second PMOS transistor (P2), the first NMOS transistor (N1), the second NMOS transistor (N2), the third NMOS transistor (N3), the fourth NMOS transistor (N4), the fifth NMOS transistor (N5), and the sixth NMOS transistor (N6) are field effect transistors.

10. The memory circuit according to claim 9, wherein the third NMOS transistor (N3), the fourth NMOS transistor (N4), the fifth NMOS transistor (N5), and the sixth NMOS transistor (N6) have the same dimension.

\* \* \* \* \*